April 9, 1968 R. B. BRADSTOCK 3,377,525

ELECTRICALLY INSULATED MOUNTING BRACKET FOR
ENCASED SEMICONDUCTOR DEVICE

Filed Dec. 3, 1965

INVENTOR.
ROBERT B. BRADSTOCK

BY [signature]

HIS ATTORNEY

United States Patent Office 3,377,525

Patented Apr. 9, 1968

3,377,525

ELECTRICALLY INSULATED MOUNTING BRACKET FOR ENCASED SEMICONDUCTOR DEVICE

Robert B. Bradstock, Erie, Pa., assignor to General Electric Company, a corporation of New York Filed Dec. 3, 1965, Ser. No. 511,433
3 Claims. (Cl. 317—234)

ABSTRACT OF THE DISCLOSURE

A mounting assembly, for an encased semiconductor device, including: a metal support having means for readily detachably mounting the semiconductor device thereon and having a substantial heat transfer surface; a metal backing plate having a first surface spaced from the support heat transfer surface by a thin film of electrical insulation and having a second surface adapted to abut a heatsink; and, a body of thermoset resin engaging and securing the support and backing plate in integral assembled relationship and establishing a relatively long creepage path therebetween.

The present invention relates to an apparatus for cooling semiconductor devices and a method for making the same. More specifically, the present invention relates to a molded semiconductor cooling apparatus and method for making the same wherein previously encountered manufacturing tolerance problems are minimized.

Successful application of semiconductor devices in electronic circuitry depends to a great extent on adequate cooling of the devices. If the P-N junction temperature of a typical semiconductor device rises high enough, permanent damage may occur to the device and it may fail as by melting or thermal runaway. Further, circuits utilizing such semiconductor devices may fail before melting or thermal runaway of the device as insufficient cooling of the device may change the operating characteristics of the device sufficiently to cause circuit malfunction. For these reasons, it is necessary to provide adequate cooling means for a semiconductor device.

In a typical semiconductor mounting, a semiconductor device is generally mounted on a threaded stud which in turn is connected to a heat dissipating means (commonly referred to as a heatsink). In most instances, the stud on which the semiconductor device is mounted is electrically at the same potential as the semiconductor device and therefore it is desirable to electrically insulate the stud from the heatsink. For this purpose, generally, thin sheets of electrical insulating material such as mica in the order of 0.001 inch or 0.002 inch in thickness have been used to insulate the stud mounted semiconductor device from the heatsink. Although this method has been found to be quite satisfactory, problems have been encountered in the manufacture of the mountings, particularly in maintaining critical tolerances.

One of the principal problems encountered is the tendency of the insulation to fracture. This is due to the insulating material being held in compression between the heatsink and a heat transfer member to which the semiconductor is mounted. As the electrical insulating material is extremely thin, unless the surfaces between which it is held are extremely smooth and free of particles, there is a tendency for the insulating material to be fractured or punctured due to such projections or particles on the heatsink or heat transfer member. This problem places a critical tolerance on the manufacturing of the device.

It is an object of this invention, therefore, to provide simple and inexpensive means for overcoming the foregoing difficulties.

It is another object of this invention to provide a method of making a device for removably mounting a semiconductor device to a heat dissipator so that the semiconductor device is electrically isolated therefrom while the mechanical stability and electrical insulating properties of the mounting device are permanently maintained under all ordinary conditions.

Another object of the present invention is to provide a molded apparatus for removably connecting semiconductor device to a heatsink to minimize manufacturing problems.

Briefly, in one form of the present invention there is provided a thermally conductive support member to which a semiconductor device is removably mounted and through which heat is transferred to a heatsink. The support member is electrically isolated from a backing plate to which the support member is connected, which may be provided by covering the base of the support member with a thin layer of insulating material. The electrical insulating material must also permit heat from the support member to be transferred therethrough to the backing plate and to the heatsink. This assembly is placed in a mold and a thermosetting resinous material, such as epoxy, is poured therein to fill any voids in the insulation between the backing plate and the support member. In addition the resinous material provides, when suitably cured, a dense mass of solidified electrically insulating resinous material securing the electrically isolated support member and backing plate together as a unitary assembly. Means are also provided for connecting the encapsulated assembly to a suitable heatsink and in accordance with the principles of operation of the present invention, heat generated in the semiconductor device will be transferred through the support member, through the layer of electrical insulation and through the backing plate to the heatsink wherein the heat will be dissipated.

Other objects and advantages of the present invention together with a better understanding thereof may be had by referring to the following detailed description of the present invention together with the accompanying drawings wherein.

Figure 1:
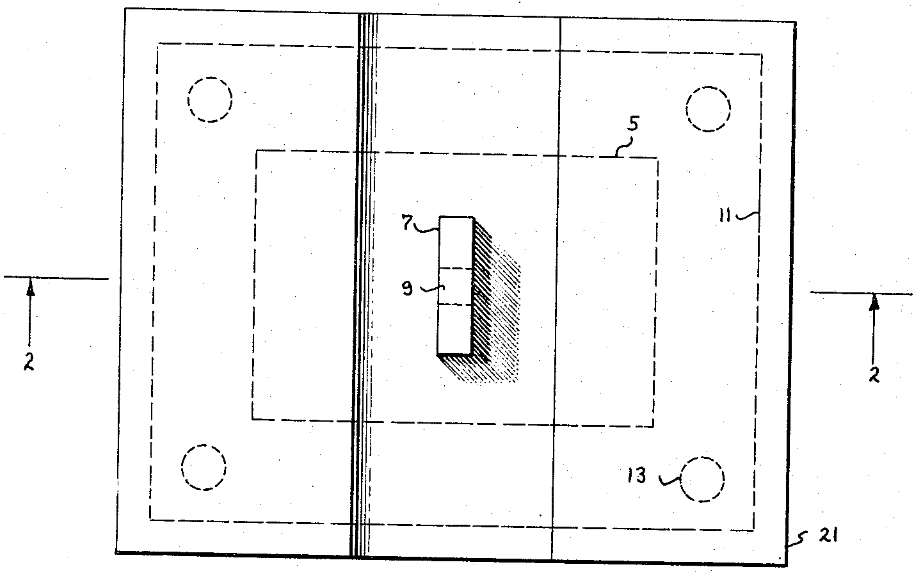
FIGURE 1 is a top view of one form of the present invention.
Figure 2:
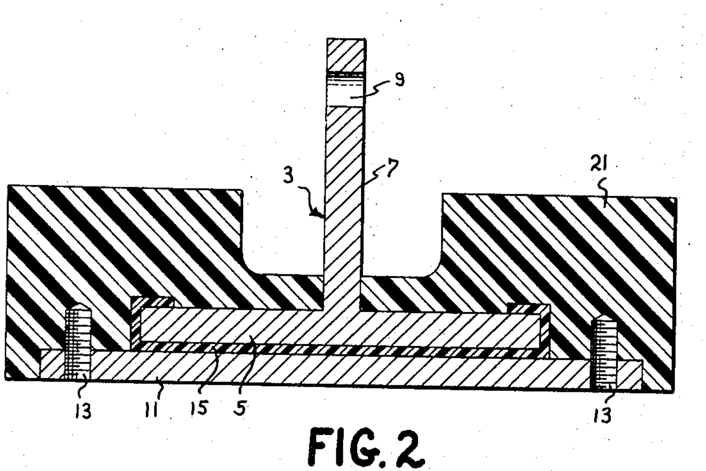
FIGURE 2 is a sectional view taken along the line 2—2 of FIGURE 1.

Turning now to FIGURES 1 and 2 of the drawings, there is shown a preferred embodiment of the present invention which includes a thermally conducting support or heat transfer member 3 to which a semiconductor device, generally mounted on a threaded stud, is removably mounted so as to be in intimate thermal contact therewith. As specifically illustrated, this support member has an inverted T-shaped configuration with a generally rectangular lower section 5 and an integral upstanding leg 7. Leg 7 is provided with an aperture 9 therein in which a stud mounted semiconductor device is adapted to be received. The support member 3 must be made of material having a high thermal conductivity so that any heat developed in the semiconductor device will be transferred through the support to a heatsink (not shown). Copper and aluminum have both been found to be satisfactory for this purpose.

There is also provided in the present invention means for connecting the support member 3 to the heatsink. Specifically, this means comprises a backing plate 11, shown as being generally rectangular in shape, and having a high thermal conductivity so as to enable heat to be transferred therethrough to the heatsink. Threaded inserts 13 are included in the backing plate 11 at each corner thereof and provide a means for connecting the backing plate 11 to the heatsink. As the backing plate 11 must also be of a high thermal conductivity, copper or aluminum have been utilized and found to provide satisfactory results.

Means are also included in the present invention which electrically isolate the support member 3 from the backing plate 11, since it is generally not desirable to have the heatsink to which the semiconductor device is connected at the same electrical potential as the semiconductor device. To this end, there may be provided a sheet of electrical insulation 15 which is disposed between the mounting support member 3 and backing plate 11. Specifically, this electrical insulation 15 may be wrapped about the lower section 5 of the support member 3 and bonded thereto by suitable sealing material. The sealing material may be of any suitable composition with the synthetic resins, particularly the epoxy family, being particularly desirable. Both Kapton, a trade name for a polyimide film material manufactured and sold by the E. I. du Pont de Nemours and Company, and mica have been found satisfactory for the electrically insulation 15.

As there is the possibility that small air pockets or voids may occur in the bonding area between the support 3 and insulation 15 or between the insulation 15 and the backing plate 11, and it is the presence of these voids which contributes to the fracture problem, means are provided for filling these voids or air spaces so as to maintain the electrical isolation between the support member 3 and the backing plate 11 and to prevent fracture of the insulation 15. Therefore, additional thermosetting resinous material is molded about the entire assembly to encapsulate it within a dense mass of solidified electrically insulating material and, as can be seen in FIGURE 2, since there is a substantial distance between the upstanding leg 7 of support member 3 and the backing plate 11, a long creepage path therebetween has been established by such resinous material. The thermosetting resinous material, therefore, provides a long creepage path and good electrical insulation, as well as a means of mechanically holding the support member, the layer of electrical insulation and the backing plate together as a complete unit. Since the electrical isolation must be maintained between support member 3 and the backing plate 11, the encapsulating resinous material must be nonconducting and the synthetic thermosetting resinous materials are also particularly desirable for this purpose. Generally, it is desirable to employ the same material for bonding the electrical insulating sheet material to the support member as for the encapsulation since then only one curing step is required. Thus, a heat transfer means is formed which is adapted to be connected to a heatsink, which is electrically insulated therefrom, and which permits heat generated in a semiconductor device mounted to the heat transfer means to be readily transferred to the heatsink so as to be dissipated therein. Moreover, the mechanical stability and electrical properties of the device are permanently maintained under all ordinary conditions.

Turning now to the method of making the heat transfer device, there is generally provided a mold (not shown) of generally rectangular configuration in which the assembly is to be prepared. Specifically, each part of the abovementioned assembly is cleaned with a suitable cleaning fluid such as methylethylketone and the parts are preheated in an oven in order to ensure uniform bonding of the materials.

Preferably, the mold is arranged so that when the backing plate 11 is placed on the bottom thereof no resinous material comes in contact with its bottom surface, as it is this surface which is in thermal contact with the heatsink and should be kept free of any foreign material. Any material collected on such surface during encapsulation would, of course, be removed before installation. The sheet of electrical insulating material has a very thin layer of sealing material applied to each side thereof and the electrical insulating material is applied to the support member 3. The support member 3, with the insulating material thereon, is then placed on the backing plate 11, and pressure is applied, as by a clamp, to the supports and backing plate 11 which aids in bonding the surfaces together. The clamps are then removed and the mold is filled with thermosetting resinous material. This is done to encapsulate the support member and backing plate into a unit and to fill any voids which might occur either between the backing plate 11 and the insulation 15 or between the support member 3 and the insulation 15. Since there are no high clamping pressures required to hold the support member to the backing plate, particles or projections therebetween have no tendency to pierce the insulation 15 and cause fracture thereof. The mold is then heated, generally in an oven, to permit the resinous material to cure. After curing, the encapsulated assembly is removed from the oven and allowed to cool.

Thus, it can be seen that by practicing the method of the present invention, there is no fracture of the insulating material in a semiconductor device mounting. Further, with the method of the present invention the problems of maintaining close manufacturing tolerances is eliminated.

While I have shown and described a particular embodiment of the present invention, it will be obvious to those skilled in the art that various changes and modifications may be made without departing from the present invention in its broader aspect and therefore it is the intention of the appended claims to cover all such changes and modifications as fall within the true spirit and scope of the present invention.

What is claimed as new and desired to be secured by Letters Patent of the United States is:

1. The method of making a mounting device for connecting a semiconductor device to a heat dissipator comprising:

(a) providing a thermally conducting support member having a base portion and an upstanding leg portion with means thereon for readily detachably mounting an encased semiconductor device;

(b) electrically insulating the base portion of said support member;

(c) placing the electrically insulated base portion of said support member in direct contact with one surface of a thermally conducting base plate the opposite surface of which is flat and adapted to be seated on a heat dissipator for transferring heat thereto;

(d) surrounding the base portion of said support member with an electrically insulating thermosetting resinous material; and (e) curing said resinous material to secure said support member and said base plate together as a unitary assembly with a mass of hardened resin thereabout providing electrical insulation and a long creepage path between said support member and the heat dissipator to which said base plate is adapted to be seated.

2. The method of claim 1 wherein the base portion of said support member is electrically insulated by bonding a thin sheet of electrical insulating material thereto with a thermosetting resinous material.

3. An electrically insulated mounting bracket for an encased semiconductor device, said bracket comprising:

(a) a metal support member having attachment means for readily removably mounting an encased semiconductor device thereon;

(b) a metal base plate having a first surface closely spaced from a surface of said support and having a second surface adapted to abut a heat sink;

(c) a relatively thin layer of electrical insulation sandwiched between said support member surface and said first surface of said plate to provide an electrically insulating heat transfer medium; and (d) a body of thermoset resinous material rigidly engaging and providing an integral molded bracket unit with said support, said insulation and said plate.

References Cited

UNITED STATES PATENTS

| | | | |
|---|---|---|---|
| 2,817,048 | 12/1957 | Thuermel et al. | 317—234 |
| 2,887,628 | 5/1959 | Zierdt | 317—234 |
| 2,986,679 | 5/1961 | Storsand | 317—234 |
| 3,058,041 | 10/1962 | Happ | 317—235 |
| 3,200,296 | 8/1965 | Bruestle | 317—100 |
| Re. 25,853 | 9/1965 | Van Namen | 174—15 |
| 3,258,661 | 6/1966 | Mierendorf et al. | 317—234 |
| 3,280,387 | 10/1966 | Emeis | 317—234 |
| 3,280,390 | 10/1966 | Rossle et al. | 317—234 |

JOHN W. HUCKERT, *Primary Examiner.*

A. M. LESNIAK, *Assistant Examiner.*